United States Patent
Dong et al.

(10) Patent No.: US 6,935,420 B1
(45) Date of Patent: Aug. 30, 2005

(54) HEAT DISSIPATION ASSEMBLY

(75) Inventors: Shun Chi Dong, Austin, TX (US); Chung-Yuan Huang, Austin, TX (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/870,241

(22) Filed: Jun. 16, 2004

(51) Int. Cl.[7] ................................................ F28F 7/00
(52) U.S. Cl. .................... 165/185; 165/75; 165/73; 361/704; 361/697
(58) Field of Search ............................ 165/72, 73, 75, 165/185; 361/704, 705, 697; 257/707; 174/16.3

(56) References Cited

U.S. PATENT DOCUMENTS

| | | | |
|---|---|---|---|
| 4,546,411 A * | 10/1985 | Kaufman | 361/705 |
| 5,168,926 A | 12/1992 | Watson et al. | |
| 5,572,070 A | 11/1996 | Ross | |
| 5,690,528 A * | 11/1997 | Kelley | 442/260 |
| 5,897,917 A * | 4/1999 | Hinshaw et al. | 422/258 |
| 6,029,740 A * | 2/2000 | Lee et al. | 165/76 |
| 6,049,458 A * | 4/2000 | Lee et al. | 361/705 |
| 6,059,116 A * | 5/2000 | Hinshaw et al. | 206/714 |
| 6,644,395 B1 * | 11/2003 | Bergin | 165/185 |
| 2002/0163076 A1 * | 11/2002 | Tzeng et al. | 257/720 |
| 2003/0112603 A1 * | 6/2003 | Roesner et al. | 361/719 |

FOREIGN PATENT DOCUMENTS

CN        2375064 Y        4/2000

* cited by examiner

*Primary Examiner*—Terrell McKinnon
(74) *Attorney, Agent, or Firm*—Wei Te Chung

(57) ABSTRACT

A heat dissipation assembly includes a heat sink having a base and a plurality of heat dissipation fins disposed on the base, thermal interface material applied to the base opposing the fins, and a cap covering the base. The cap includes a body which shields the thermal interface material, and first and second wings extending from the body. The first wing is rotatable relative to the body to facilitate detaching the cap from the base of the heat sink.

20 Claims, 5 Drawing Sheets

HEAT DISSIPATION ASSEMBLY

BACKGROUND OF THE INVENTION

1. Field of the Invention

The present invention relates to a heat dissipation assembly having a heat sink, and more particularly to a heat dissipation assembly having a removable protective cap for enclosing thermal grease on the heat sink, thereby protecting the thermal grease from contamination before the heat sink is assembled to a CPU/CPU module.

2. Description of Prior Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example by using a heat sink attached to the CPU in the enclosure. This allows the CPU and other electronic components in the enclosure to function within their normal operating temperature ranges, thereby assuring the quality of data management, storage and transfer.

To improve heat conductivity between a heat sink and a CPU, thermal interface material such as thermal grease is often applied to a bottom face of the heat sink. However, thermal grease cannot be applied to the heat sink in advance since it is not solid at ambient temperature and may contaminate surrounding articles or be contaminated by dust or foreign particles before the heat sink is attached to the CPU. Conventionally, the thermal grease is spread onto the heat sink just prior to attachment of the heat sink to the CPU. This operation extends the time needed for said attachment.

To overcome the above problem, various grease covers have been developed. U.S. Pat. No. 6,049,458 discloses a grease cover attached to a bottom face of a heat sink to enclose thermal grease spread on the bottom of the heat sink. The thermal grease cannot be contaminated by dust or foreign particles, and does not contaminate surrounding articles when the heat sink is transported or handled. By using the grease cover, the thermal grease can be applied to the heat sink in advance, thereby simplifing the process of attachment of the heat sink to the CPU. However, the grease cover is attached to the bottom face of the heat sink by adhesive. The adhesive must be cleaned from the heat sink before the heat sink is attached to the CPU. This is unduly inconvenient.

SUMMARY OF THE INVENTION

Accordingly, an object of the present invention is to provide a heat dissipation assembly having a heat sink and a grease cover readily attached to or detached from the heat sink.

In order to achieve the object set out above, a heat dissipation assembly in accordance with a preferred embodiment of the present invention comprises a heat sink having a base and a plurality of heat dissipation fins disposed on the base, thermal interface material applied to the base opposing the fins, and a cap covering the base. The cap includes a body which shields the thermal interface material, and first and second wings extending from the body. The first wing is rotatable relative to the body to facilitate detaching the cap from the base of the heat sink.

Other objects, advantages and novel features of the present invention will become more apparent from the following detailed description when taken in conjunction with the accompanying drawings, in which:

DETAILED DESCRIPTION OF THE INVENTION

The heat dissipation assembly in accordance with the preferred embodiment of the present invention comprises a heat sink 6, thermal interface material 7 such as thermal grease which is applied to the heat sink 6, and a cap 1 employed to the heat sink 6 for preventing the thermal interface material 7 from being contaminated by dust or foreign particles before the heat sink 6 is attached to a CPU (not shown).

Figure 1:
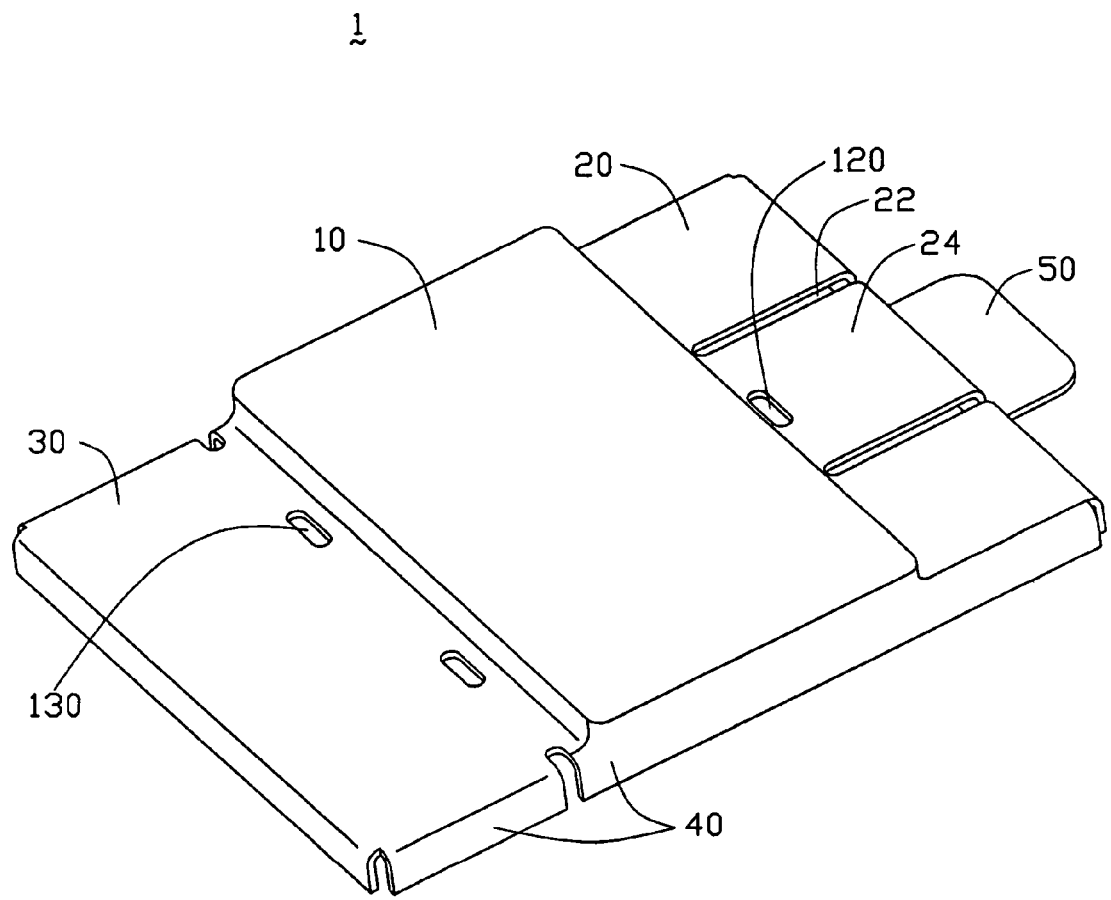
FIG. 1 is an isometric view of a grease cap of a heat dissipation assembly in accordance with the preferred embodiment of the present invention.

FIG. 1 shows the cap 1 which can be employed to the heat sink 6. The cap 1 integrally comprises a body 10, a first wing 20, a second wing 30, a flange 40 and a tab 50. The first and second wings 20, 30 extend from opposite edges of the body 10 respectively. The flange 40 extend perpendicularly from outer edges of the body 10, the first and second wings 20, 30. The tab 50 extends perpendicularly from an outer edge of the flange 40, for facilitating detachment of the cap 1 from the heat sink 6. A pair of parallel grooves 22 is defined in the first wing 20 and divides the first wing 20 in three portions. A middle portion 24 of the first wing 20 is integrally connected with the tab 50. A notch 120 is defined at the middle portion 24 of the first wing 20 adjacent the body 10 for facilitating rotation of the middle portion 24 of the first wing 20 relative to the body. A plurality of slots 130 is defined in at a joint of the body 10 and the second wing 30, for facilitating rotation of the body relative to the second wing 30.

Figure 2:
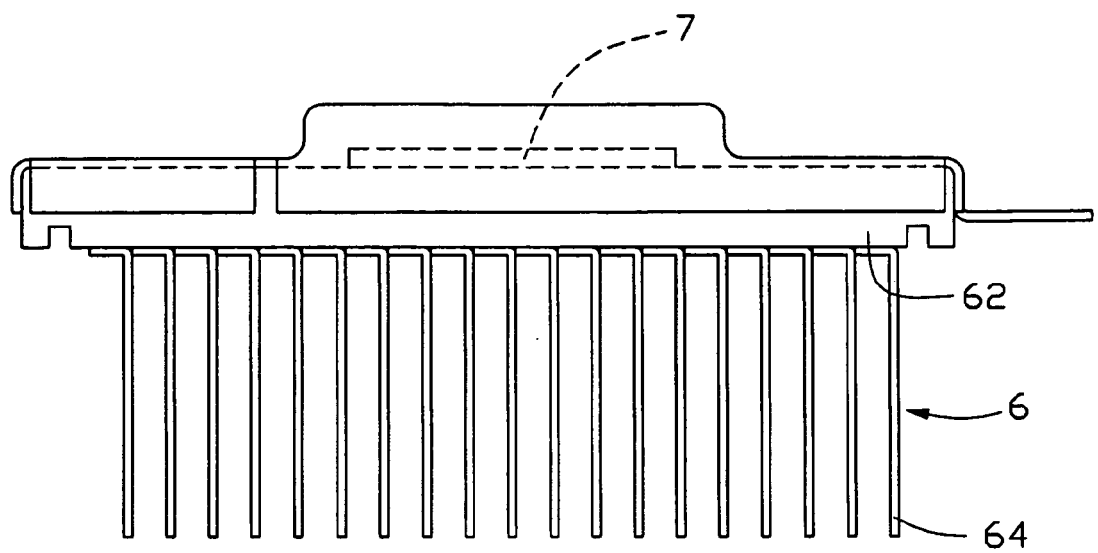
FIG. 2 is an assembled, isometric view of the heat dissipation assembly.

See FIG. 2, the heat sink 6 comprises a base 62 for absorbing heat from the CPU and a plurality of fins 64 extending from a surface of the base 62 for dissipating heat from the heat sink 6 to ambient air. The thermal interface material 7 is applied to the base 62 at an opposite surface opposite to the fins 64. The cap 1 is employed to the heat sink 6 with the body 10, the first and second wings 20, 30 covering said opposite surface and with the flanges 40 slightly interferentially surrounding side surfaces adjacent said opposite surface of the base 62. The tab 50 is extended beyond the base 62 of the heat sink 6. Especially, the body 10 of the cap 1 is protruded from the first and second wings 20, 30, that is, the body 10 is distant away from the base 62 relative to the first and second wings 20, 30. The body is also disposed above the thermal interface material 7 for shielding it.

Figure 3A:
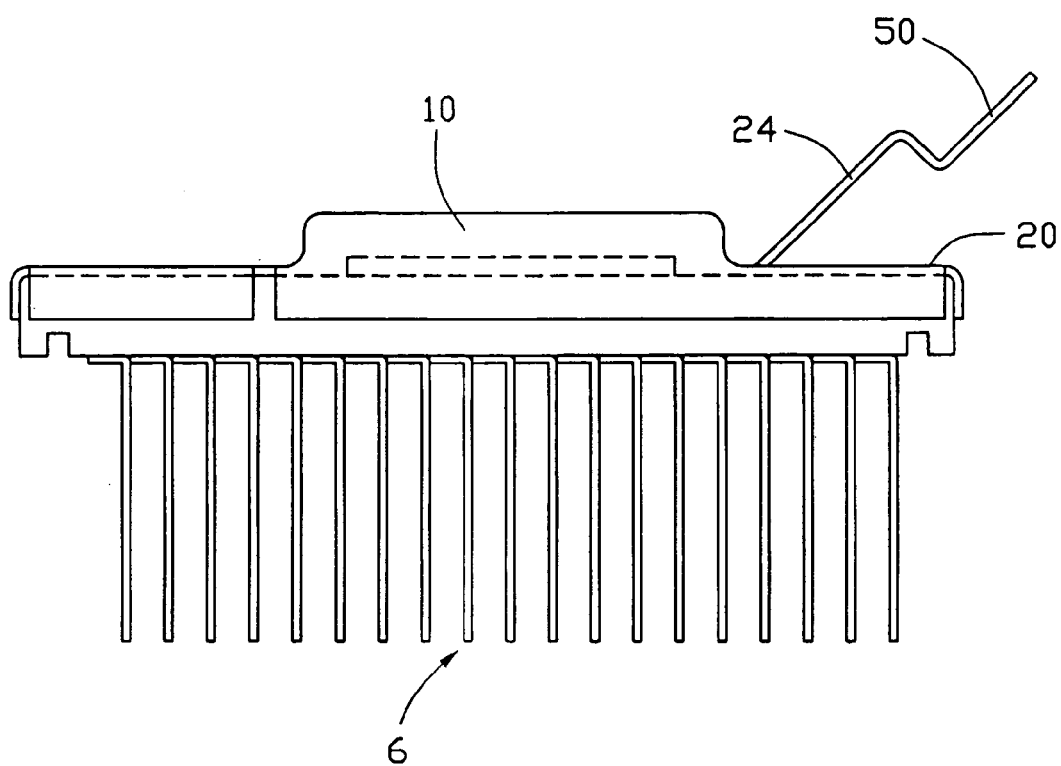
FIGS. 3A, 3B, 3C and 3D are side views of the heat dissipation assembly, showing the detachment procedure of the grease cap from the heat sink.
Figure 3B:
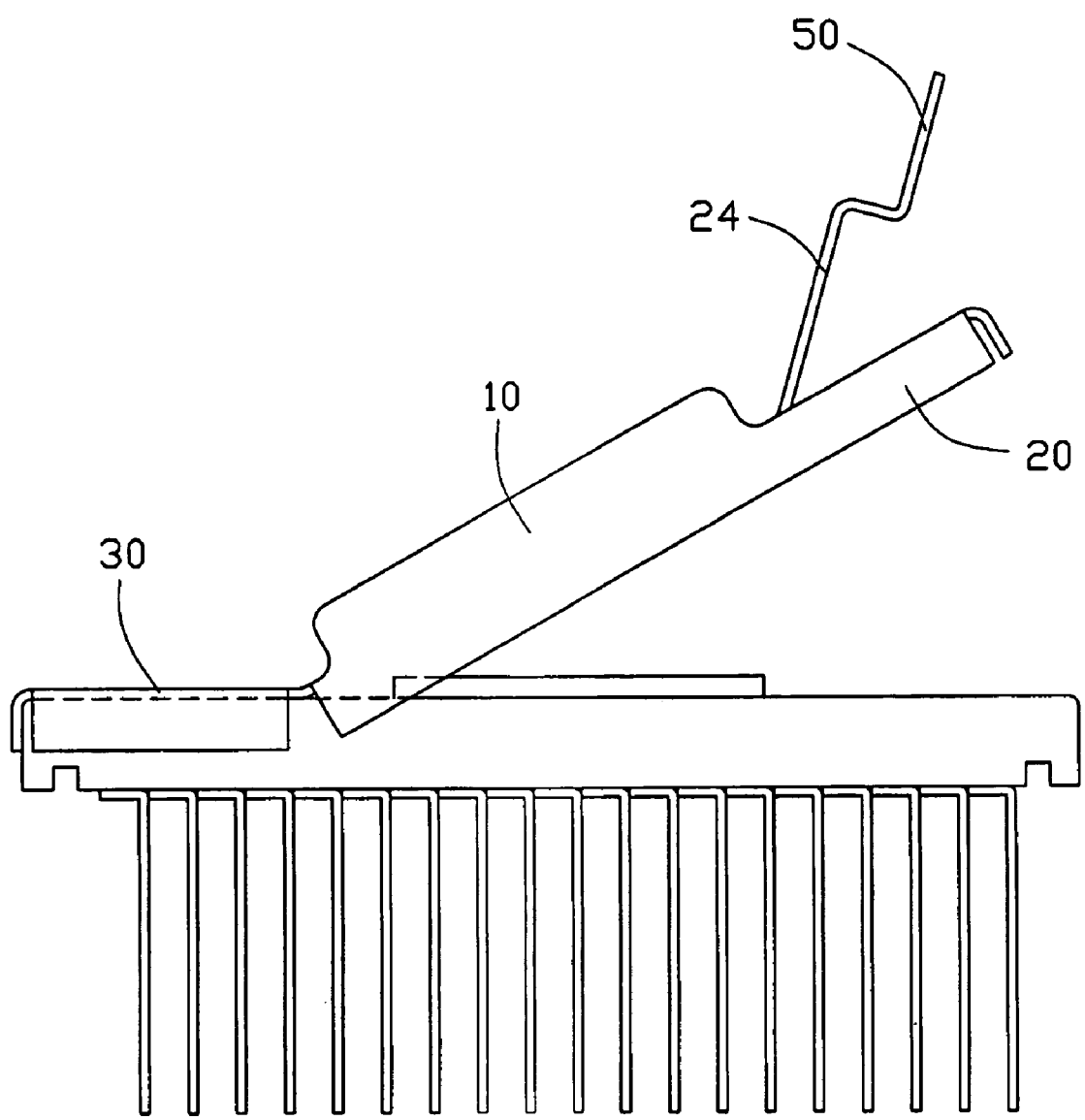

To detach the cap 1 from the heat sink 6, the tab 50 is pulled, causing the middle portion 24 of the first wings 20 to rotate along a joint line of the body 10 and the first wing 20 (see FIG. 3A). The tab 50 is still pulled to cause the whole first wing 20 and the body 10 to rotate along a joint line of the body 10 and the second wing 30 (see FIG. 3B) and to be lifted. The tab 50 is further pulled to lift the second wing 30

Figure 3C:
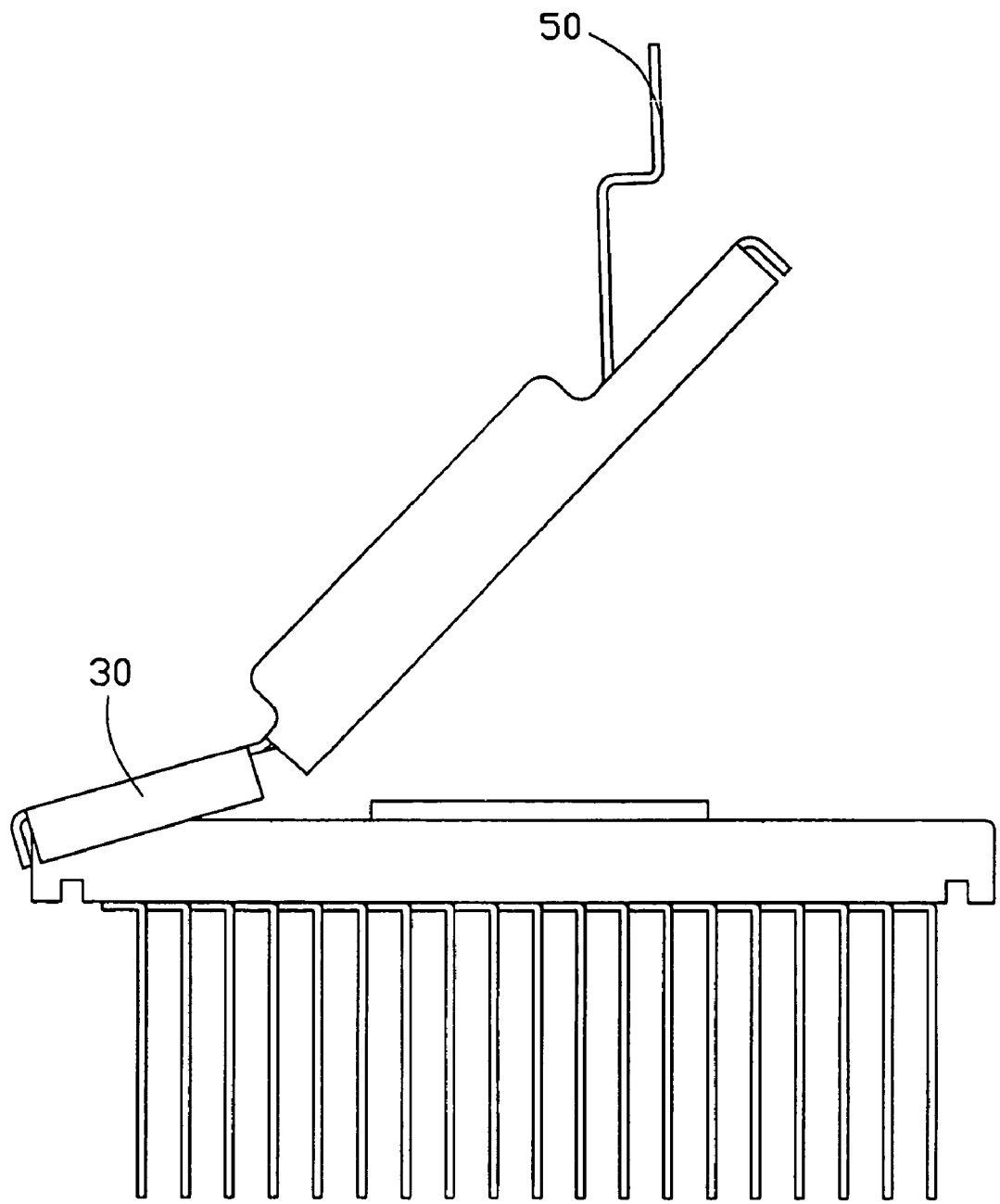
Figure 3D:
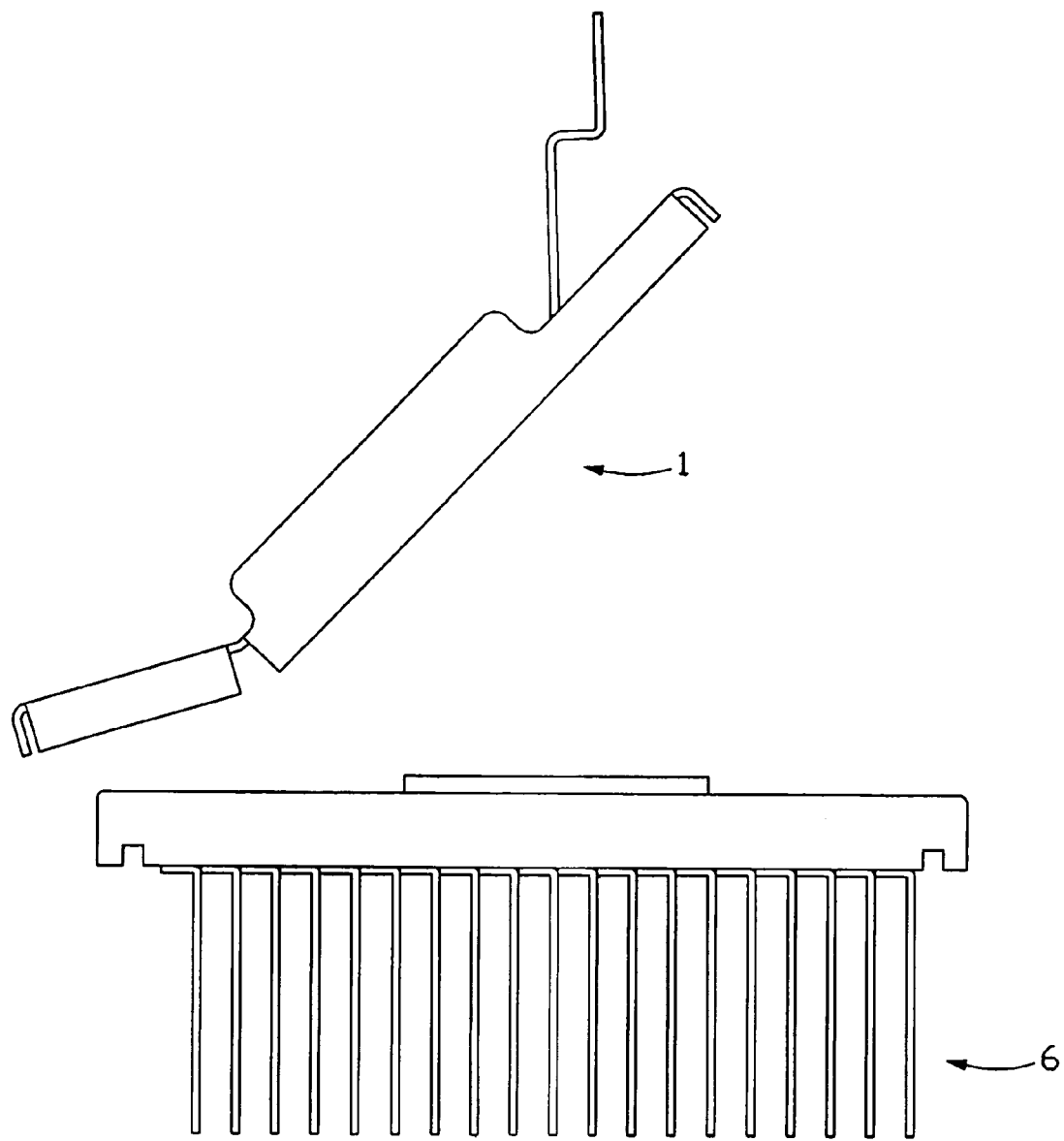

(see FIG. 3C) and at last the whole cap 1 is detached from the heat sink 6 (see FIG. 3D).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cap for protecting thermal interface material applied on a heat sink base, comprising:
   a body adapted to shield the thermal interface material;
   a first wing extending from the body and comprising a rotatable portion; and
   a second wing extending from the body;
   wherein the rotatable portion of the first wing is rotatable relative to the body and the body is rotatable relative to the second wing.

2. The cap of claim 1, wherein the cap is integrally formed.

3. The cap of claim 2, wherein a notch is defined in the first wing, for facilitating rotation of the first wing relative to the body.

4. The cap of claim 2, wherein a plurality of slots is defined in the cap at a joint of the second wing and the body, for facilitating rotation of the body relative to the second wing.

5. The cap of claim 2, wherein a tab extends from an outer edge of the cap and integrally connect with the first wing.

6. The cap of claim 5, wherein a pair of grooves is defined in the first wing, and the rotatable portion is disposed between the grooves and integrally connected with the tab.

7. The cap of claim 1, wherein a flange extends perpendicularly from free edges of the body and the first and second wings, adapted to engage with the heat sink base.

8. The cap of claim 1, wherein the body is protruded beyond the first and second wings.

9. The cap of claim 1, wherein the first and second wings are disposed at opposite sides of the body.

10. A heat dissipation assembly comprising:
    a heat sink comprising a base and a plurality of heat dissipation fins disposed on the base;
    thermal interface material applied to the base opposing the fins; and
    a cap covering the base, the cap comprising a body which shields the thermal interface material, and first and second wings extending from the body, the first wing being rotatable relative to the body.

11. The heat dissipation assembly of claim 10, wherein a notch is defined in the cap at a joint of the first wing and the body.

12. The heat dissipation assembly of claim 10, wherein a plurality of slots is defined in the cap at a joint of the second wing and the body.

13. The heat dissipation assembly of claim 10, wherein a flange extends perpendicularly from free edges of the body and the first and second wings, slightly interferentially surrounding side surfaces of the base.

14. The heat dissipation assembly of claim 13, wherein a tab extends from an outer edge of the flange.

15. The heat dissipation assembly of claim 10, wherein the body is protruded away from the base.

16. The heat dissipation assembly of claim 10, wherein the first and second wings are disposed at opposite sides of the body.

17. A heat dissipation assembly comprising:
    a heat sink comprising a base and a plurality of heat dissipation fins disposed on the base;
    thermal interface material applied to the base opposing the fins; and
    a rigid cap covering the base and shielding the thermal interface material; wherein the cap defines a body and at least one section rotatable relative to said body at joined lines.

18. The heat sink assembly of claim 17, wherein the cap includes circumferential walls grasping the base, and said joined line separates said circumferential walls for allowing rotation between the two sections.

19. The heat sink assembly of claim 17, wherein the base is rectangular and the joined line is parallel to one edge of the base.

20. The heat sink assembly of claim 17, wherein the joined line is outwardly beside the thermal interface material so that rotation of one of said two sections allows full inspection of the thermal interface material without removing the whole cap from the base.

* * * * *